(12) United States Patent
Yun et al.

(10) Patent No.: US 8,008,943 B2
(45) Date of Patent: Aug. 30, 2011

(54) SEMICONDUCTOR DEVICE

(75) Inventors: Tae-Sik Yun, Gyeonggi-do (KR);
Kang-Seol Lee, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/958,634

(22) Filed: Dec. 2, 2010

(65) Prior Publication Data
US 2011/0068821 A1    Mar. 24, 2011

Related U.S. Application Data

(62) Division of application No. 12/343,645, filed on Dec. 24, 2008, now Pat. No. 7,868,647.

(30) Foreign Application Priority Data

Nov. 6, 2008    (KR) .................. 10-2008-0110066

(51) Int. Cl.
*H03K 19/00*    (2006.01)

(52) U.S. Cl. ............................................ 326/16; 326/26
(58) Field of Classification Search .................... 326/16, 326/21, 26
See application file for complete search history.

(56) References Cited

U.S. PATENT DOCUMENTS

| 7,218,134 | B1 * | 5/2007 | Ho .................................. 326/16 |
| 7,714,612 | B1 * | 5/2010 | Pertijs ............................ 326/62 |
| 7,770,084 | B2 * | 8/2010 | Whetsel ........................ 714/727 |

* cited by examiner

*Primary Examiner* — James Cho
(74) *Attorney, Agent, or Firm* — IP & T Group LLP

(57) ABSTRACT

A semiconductor device includes a plurality of pads configured to receive a plurality of external signals, an internal circuit configured to perform a predetermined internal operation in response to one of the external signals that is inputted through one of the plurality of pads, and a signal transferring unit configured to receive the external signal, output the external signal to an internal circuit an output signal during a normal mode, and output a fixed signal regardless of changes in the external signal to the internal circuit in a test mode.

9 Claims, 4 Drawing Sheets

US 8,008,943 B2

SEMICONDUCTOR DEVICE

CROSS-REFERENCE TO RELATED APPLICATION

This application is a division of U.S. patent application Ser. No. 12/343,645 filed on Dec. 24, 2008 now U.S. Pat. No. 7,868,647, which claims priority of Korean patent application number 10-2008-0110066, filed on Nov. 6, 2008. The disclosure of each of the foregoing applications is incorporated herein by reference in its entirety.

BACKGROUND OF THE INVENTION

The present invention relates to a semiconductor design technology, and more particularly, to a semiconductor device capable of preventing a voltage level of a pad which is not used in a wafer burn-in test mode operation from being floated.

Generally, a semiconductor device uses a method of performing an objective operation through an operation of receiving or outputting a plurality of electric signals which swing within a predetermined range of a voltage level.

At this time, the plurality of electric signals which swing within the predetermined range of a voltage level may be a power supply voltage or an internal voltage fixed to a particular voltage level for operating an internal circuit of the semiconductor device in an analog aspect, or may be a logic signal classified into a logic high level or a logic low level according to a particular voltage level for operating the internal circuit of the semiconductor device digitally.

However, when the semiconductor device performs the objective operation by using the electric signal, a noise or a spark is generated in the used electric signal for unaccountable reason and thus an error may occur preventing the semiconductor device from normally performing the objective operation.

Besides, when a power-up operation is performed by initially supplying a power to the semiconductor device, a voltage level or a logic level of an internally used electric signal may not have a target value.

To solve these problems, the semiconductor device has been provided with a reset circuit inside the semiconductor device for resetting a voltage level or a logic level of an internally used electric signal.

That is, when the power-up operation is performed by initially supplying a power to the semiconductor device and also when an abnormal operation due to the noise or spark generated in the semiconductor device is detected, the reset circuit included in the semiconductor device makes the semiconductor device normally perform an operation by resetting an electric signal used in the semiconductor device.

At this time, an activation period of an operation of the reset circuit included in the semiconductor device is defined through a Mode Register Set (MRS) or is determined according to a reset signal. For instance, in an activation period of the reset signal, the reset circuit is operated so that a plurality of internal circuits included in the semiconductor device are initialized.

In this manner, a designer could prevent the semiconductor device from being abnormally operated by appropriately adjusting a period and timing of an activation of the reset signal defined by the MRS at the step of designing the semiconductor device.

However, when the semiconductor device is operated, the semiconductor device may be abnormally operated for an unpredictable reason in unpredictable circumstances. In this case, the reset signal defined by the MRS cannot be properly activated, and as a result, the abnormal operation of the semiconductor device may not be prevented.

Therefore, the semiconductor device according to the related art is additionally provided with an exclusive pad for receiving the reset signal externally (e.g., from the outside of the semiconductor device) besides defining the reset signal in the MRS in order to define the activation period of the reset signal, whereby the semiconductor device can be initialized whenever it is detected that the semiconductor device is abnormally operated.

FIG. 1 is a block diagram depicting a system for defining a reset signal according to a conventional semiconductor device.

Referring to FIG. 1, the conventional semiconductor device is additionally provided with an exclusive pad, i.e., a reset input pad 100, for receiving an external reset signal OUT_RESETb as well as defining an MRS reset signal MRS_RESETb in an MRS 120 in order to define an activation period of an internal reset signal RESETb.

To be specific, the related semiconductor device includes the reset input pad 100 for receiving the external reset signal OUT_RESETb from the outside; a reset input buffer 110 for receiving and buffering the external reset signal OUT_RESETb inputted from the reset input pad 100 and for outputting the buffered signal as a buffered reset signal BUF_OUT_RESETb; a plurality of internal circuits 150_1 to 150_N for respectively performing predetermined internal operations; a reset unit 140 for resetting the plurality of internal circuits 150_1 to 150_N by controlling an activation of the internal reset signal RESETb in response to a power-up signal POWER_UPb, the MRS reset signal MRS_RESETb defined in the MRS 120 and the buffered reset signal BUF_OUT_RESETb outputted through the reset input buffer 110.

Based on the above-described structure, an operation of defining the internal reset signal RESETb for resetting the plurality of internal circuits 150_1 to 150_N included in the related semiconductor device is described as follows.

First, when the MRS reset signal MRS_RESETb defined in the MRS 120 is activated, the buffered reset signal BUF_OUT_RESETb inputted from the outside through the reset input pad 100 and reset input buffer 110 is activated, and also the power-up signal POWER_UPb is activated, the reset unit 140 activates the internal reset signal RESETb and the plurality of internal circuits 150_1 to 150_N are initialized when the internal reset signal RESETb is activated.

At this time, the MRS reset signal MRS_RESETb defined in the MRS 120 can be activated under predictable abnormal circumstances, i.e., circumstances in which the plurality of internal circuits 150_1 to 150_N should be initialized, e.g., when it is detected that some of the plurality of internal circuits 150_1 to 150_N are abnormally operated or in case of escaping from an operation mode in which the power supplied to partial internal circuits among the plurality of internal circuits 150_1 to 150_N is cut-off while the semiconductor device is operated in, e.g., a power-down mode.

The buffered reset signal BUF_OUT_RESETb inputted from the outside through the reset input pad 100 and the reset input buffer 110 can be activated by a user anytime at the step of actually using the semiconductor device.

Also, the power-up signal POWER_UPb can be activated when the semiconductor device is initially supplied with the power.

As above-mentioned, the related semiconductor device performs an operation of activating the internal reset signal RESETb at proper timings for various situations. Through this operation, the semiconductor device can be initialized at proper timings in various cases so that the semiconductor device may be operated stably.

Meanwhile, generally, the semiconductor device is mass-produced through very complicated and difficult processes. As a matter of course, while the semiconductor device is mass-produced, a defective semiconductor device, which cannot be operated for the original purpose, is always manufactured because of variations of the manufacturing process.

Although the semiconductor device which cannot be operated for the original purpose like this should be distinguished from the normally operated semiconductor device, it is not easy to determine whether the semiconductor device is normally operated or not since the semiconductor device is generally small-sized and highly integrated. Therefore, generally, a company which mass-produces semiconductor devices tests the mass-produced semiconductor devices in multiple steps. When a semiconductor device passes all the tests, it is classified as a normal semiconductor device.

For this reason, there are various test processes in the manufacturing process of the semiconductor device. At this time, the semiconductor device produced through the manufacturing process undergoes a test in a wafer state, and this test is called a wafer burn-in test. Unlike a packaged state, in the wafer state of a semiconductor device, while there are a plurality of pads for receiving the electric signal, they are not accompanied by pins capable of directly supplying the electric signal to the plurality of pads. Therefore, in order to normally perform the wafer burn-in test, test equipment for the wafer burn-in test capable of supplying the electric signal to the plurality of pads included in the semiconductor device is needed.

That is, the wafer burn-in test can be normally performed by directly supplying the electric to the plurality of pads included in the semiconductor device through a plurality of probes included in the test equipment.

At this time, while the number of the probes included in the test equipment is fixed, the number of pads included in the semiconductor device is variable according to design needs. Therefore, generally, when the wafer burn-in test is performed, only predetermined pads among the plurality of pads included in the semiconductor device are connected to probes supplied with the electric signal. The other pads are not connected from the probes and thus no electric signals are supplied to them.

However, the predetermined pads among the plurality of pads may be relatively close to the other pads. No matter how precisely the electric signal are supplied to the predetermined pads location-wise, the neighboring other pads may also be supplied with a significant amount of the electric signal and thus a result of the wafer burn-in test may be inaccurate. Therefore, even a normal semiconductor device may be classified as a defective semiconductor device.

Particularly, in case of resetting the whole semiconductor device in response to the external reset signal OUT_RESETb inputted from the outside through the reset input pad 100 such as the semiconductor device shown in FIG. 1, because of the external reset signal OUT_RESETb inputted with a wrong logic level from the outside of the semiconductor through the reset input pad 100, a problem of incorrectly resetting the semiconductor device may occur.

SUMMARY OF THE INVENTION

The present invention has been proposed to overcome the above-mentioned problems. Some embodiments of the present invention are directed to providing a semiconductor device capable of not being influence by a falsely inputted electric signal for normally performing a wafer burn-in test even though the electric signal is mistakenly inputted to unused pads.

Also, some embodiments of the present invention are directed to providing a semiconductor device capable of preventing an internal circuit from being initialized during the wafer burn-in test by inactivating an internal reset signal generated in response to a reset signal inputted from the outside through a reset input pad even if the externally inputted reset signal is in an activated state in the wafer burn-in test.

In accordance with an aspect of the present invention, a semiconductor device includes a plurality of pads configured to receive a plurality of external signals, an internal circuit configured to perform a predetermined internal operation in response to one of the external signals that is inputted through one of the plurality of pads, and a signal transferring unit configured to receive the external signal, output the external signal to an internal circuit an output signal during a normal mode, and output a fixed signal regardless of changes in the external signal to the internal circuit in a test mode.

In accordance with another aspect of the present invention, there is provided a semiconductor device, including: a signal generating unit configured to generate a bandwidth selection signal for adjusting a data input/output bandwidth or generate a test mode selection signal for controlling an entry into a test mode in response to a signal inputted from the outside through a predetermined first pad; a reset unit configured to initialize an internally provided circuit in response to a signal inputted from the outside through a predetermined second pad; and a logic level fixing unit configured to output a fixed signal regardless of a logic level of the signal inputted through the predetermined second pad at a predetermined logic level in response to the test mode selection signal.

In accordance with still another aspect of the present invention, there is provided a semiconductor device, including: a signal generating unit configured to generate a bandwidth selection signal for adjusting a data input/output bandwidth or generate a test mode selection signal for controlling an entry into a test mode in response to a plurality of data input/output bandwidth adjusting signals inputted from the outside through a plurality of control signal input pads; a reset unit configured to initialize a plurality of internally provided circuits in response to a reset signal inputted from the outside through a reset signal input pad; and a logic level fixing unit configured to output a fixed signal regardless of a logic level of the reset signal in response to the test mode selection signal.

DESCRIPTION OF SPECIFIC EMBODIMENTS

Hereafter, preferred embodiments of the present invention are described with reference to the accompanying drawings. However, the present invention is not limited to the below disclosed embodiments but may be modified variously. The specific embodiments of the preset invention are provided as examples of the present invention only.

First Embodiment

Figure 1:
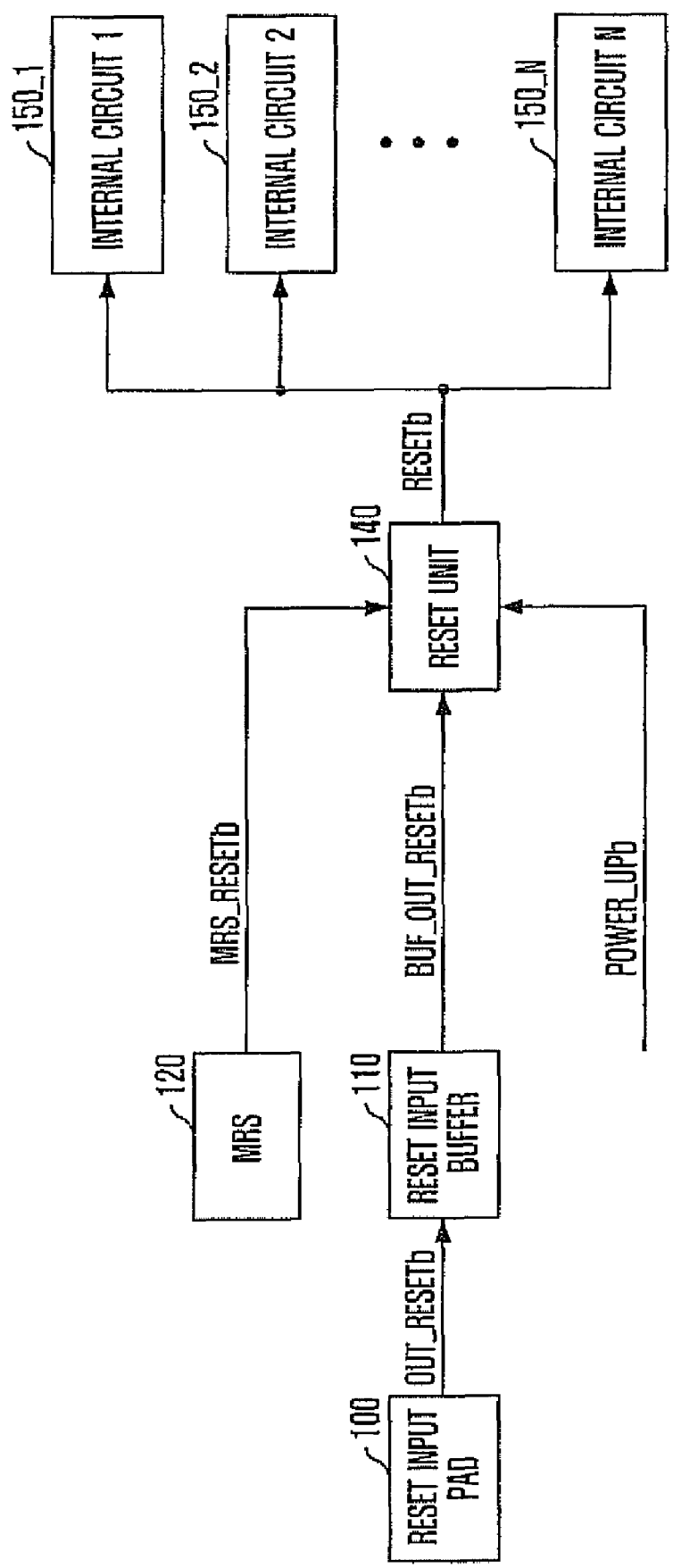
FIG. 1 is a block diagram depicting a system for defining a reset signal according to a conventional semiconductor device.
Figure 2:
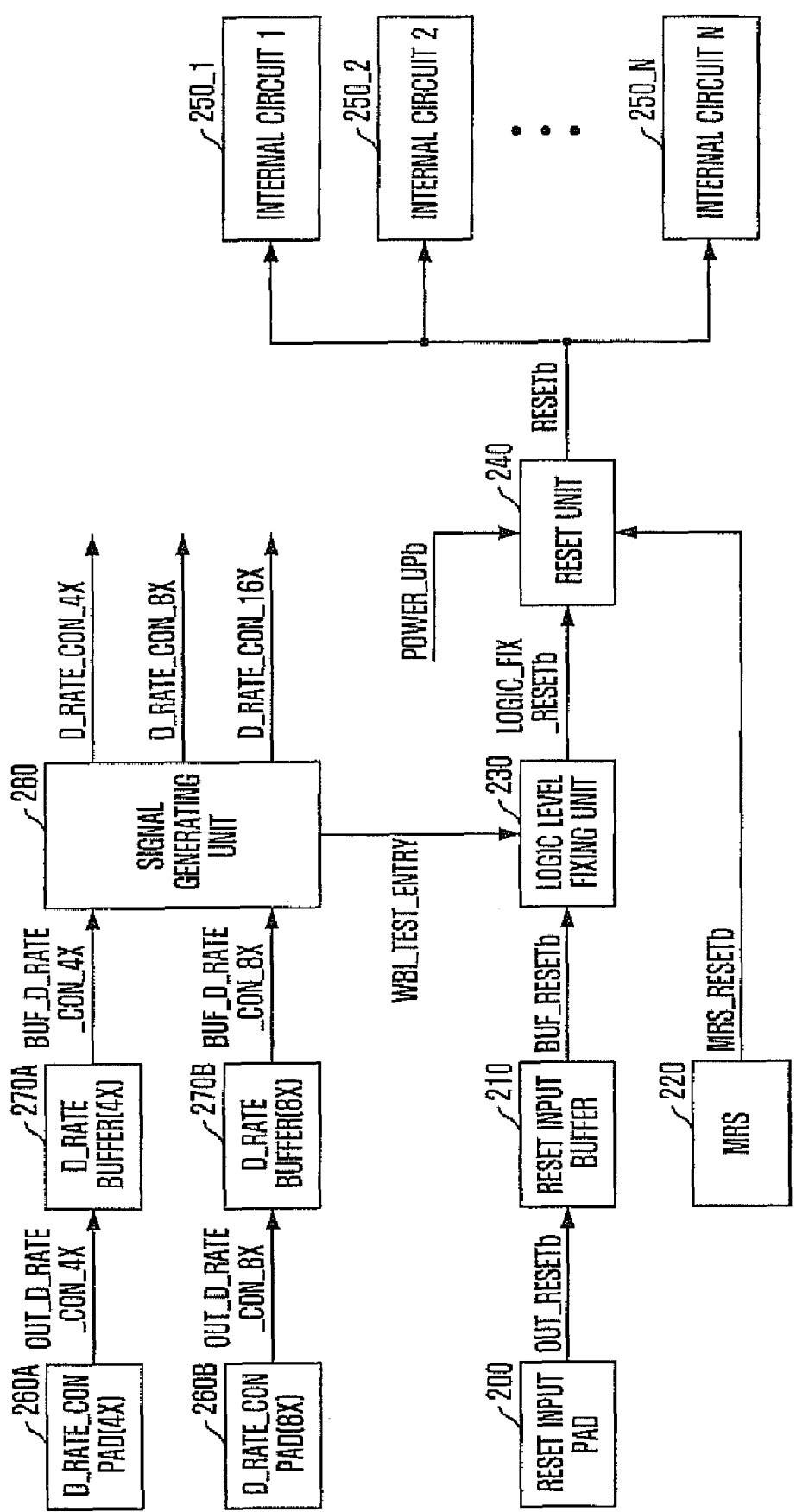
FIG. 2 is a block diagram for explaining an operation of filtering a reset signal inputted from the outside through a reset input pad when a wafer burn-in test is performed in a semiconductor device in accordance with a first embodiment of the present invention.

FIG. 2 is a block diagram for explaining an operation of filtering a reset signal inputted from the outside through a reset input pad when a wafer burn-in test is performed in a semiconductor device in accordance with a first embodiment of the present invention.

As shown, the semiconductor device in accordance with the first embodiment of the present invention includes a signal generating unit 280, a logic level fixing unit 230, and a reset unit 240.

The signal generating unit 280 generates signals D_RATE_CON_4X, D_RATE_CON_8X and D_RATE_CON_16X for adjusting a data input/output bandwidth or for generating a test signal WBI_TEST_ENTRY for controlling an entry into a test mode in response to signals OUT_D_RATE_CON_4X and OUT_D_RATE_CON_8X inputted from the outside through predetermined first pads 260A and 260B.

The logic level fixing unit 230 fixes an external reset signal OUT_RESETb applied through a predetermined second pad 200, i.e., a reset input pad, to a predetermined logic level in response to the test signal WBI_TEST_ENTRY for controlling the entry into the test mode, and outputs a fixed reset signal LOGIC_FIX_RESETb.

The reset unit 240 generates an internal reset signal RESETb for resetting a plurality of internal circuits 250_1 to 250_N in response to the fixed reset signal LOGIC_FIX_RESETb outputted from the logic level fixing unit 230 and a power-up signal POWER_UPb applied externally.

Also, the semiconductor device further includes first input buffers 270A and 270B connected to the predetermined first pads 260A and 260B for receiving and buffering the signals OUT_D_RATE_CON_4X and OUT_D_RATE_CON_8X inputted from the outside to thereby output buffered signals BUF_D_RATE_CON_4X and BUF_D_RATE_CON_8X; and a second input buffer 210, i.e., a reset input buffer, connected to the predetermined second pad 200 for receiving and buffering the external reset signal OUT_RESETb inputted from the outside and for outputting a buffered reset signal BUF_RESETb.

Therefore, the signal generating unit 280 generates the signals D_RATE_CON_4X, D_RATE_CON_8X and D_RATE_CON_16X for adjusting the data input/output bandwidth or generates the test signal WBI_TEST_ENTRY for controlling the entry into the test mode in response to the signals BUF_D_RATE_CON_4X and BUF_D_RATE_CON_8X outputted by buffering the signals OUT_D_RATE_CON_4X and OUT_D_RATE_CON_8X inputted from the outside through the predetermined first pads 260A and 260B.

The logic level fixing unit 230 fixes the external reset signal OUT_RESETb externally inputted through the predetermined second pad 200 to the predetermined logic level in response to the test signal WBI_TEST_ENTRY for controlling the entry into the test mode and outputs the fixed reset signal LOGIC_FIX_RESETb. The reset unit 240 outputs the internal reset signal RESETb for resetting the internal circuits 250_1 to 250_N in response to the fixed reset signal LOGIC_FIX_RESETb outputted from the logic level fixing unit 230. The buffered reset signal BUF_RESETb is outputted from the second input buffer 210 to the logic level fixing unit 230 by buffering the external reset signal OUT_RESETb received through the predetermined second pad 200.

At this time, the configuration of the reset unit 240 will be described in detail. The reset unit 240 serves to reset the internal circuits 250_1 to 250_N in response to an MRS reset signal MRS_RESETb outputted from a Mode Register Set (MRS) 220, the power-up signal POWER_UPb and the fixed reset signal LOGIC_FIX_RESETb outputted by applying the buffered reset signal BUF_RESETb, which is outputted by buffering the external reset signal OUT_RESETb externally inputted through the predetermined second pad 200, to the logic level fixing unit 230.

Based on the above-described structure, an operation of the semiconductor device in accordance with the first embodiment of the preset invention is described as follows.

First, it is shown that the predetermined first pads 260A and 260B are provided with two pads, i.e., D_RATE_CON PAD (4X) and D_RATE_CON PAD(8X). This is because the signals OUT_D_RATE_CON_4X and OUT_D_RATE_CON_8X are assumed to be received from the outside through the predetermined first pads 260A and 260B shown in FIG. 2 in order to perform the data input/output bandwidth adjusting operation when a semiconductor memory device capable of performing a data input/output operation performs the data input/output operation.

That is, in the general semiconductor device, there is a signal inputted for defining an operational mode of the semiconductor device externally from the outside of the semiconductor device other than the MRS 220 for defining the operational mode of the semiconductor device in the inside of the semiconductor device, and it is assumed that the predetermined first pads 260A and 260B of the first embodiment of the present invention shown in FIG. 2 are pads for receiving the signal for defining the operational mode of the semiconductor device externally from the outside of the semiconductor device. It is also assumed that the signal inputted through the predetermined first pads 260A and 260B for defining the operational mode of the semiconductor device externally from the outside of the semiconductor device serves to perform the data input/output bandwidth adjusting operation in the semiconductor memory device.

Accordingly, if the semiconductor memory device has three data input/output bandwidths D_RATE_CON_4X, D_RATE_CON_8X and D_RATE_CON_16X classified into X4, X8 and X16, an operation of selecting the data input/output bandwidth of the semiconductor memory device is performed by combining the signals OUT_D_RATE_CON_4X and OUT_D_RATE_CON_8X inputted from the outside through the predetermined first pads 260A and 260B that includes the two pads D_RATE_CON PAD(4X) and D_RATE_CON PAD(8X). If the semiconductor memory device has five data input/output bandwidths classified into X4, X8, X16, X32 and X64, the number of pads provided to the predetermined first pads is increased to three.

The signal generating unit 280 generates the signals D_RATE_CON_4X, D_RATE_CON_8X and D_RATE_CON_16X for adjusting the data input/output bandwidth in response to the signals OUT_D_RATE_CON_4X and OUT_D_RATE_CON_8X for adjusting the data input/output bandwidth inputted from the outside through the predetermined first pads 260A and 260B that includes the two pads D_RATE_CON PAD(4X) and D_RATE_CON PAD(8X). However, it also generates the test signal WBI_TEST_ENTRY for controlling the entry into the wafer burn-in test mode.

As above-mentioned, the signal generating unit 280 can generate not only the signals D_RATE_CON_4X, D_RATE_CON_8X and D_RATE_CON_16X for adjusting the data input/output bandwidth in response to the signals OUT_D_RATE_CON_4X and OUT_D_RATE_CON_8X for adjusting the data input/output bandwidth inputted from the outside through the predetermine first pads 260A and 260B but also the test signal WBI_TEST_ENTRY for controlling the entry into the wafer burn-in test mode. This is possible because the predetermined first pads 260A and 260B are constructed with two pads D_RATE_CON PAD(4X) and D_RATE_CON PAD(8X), and accordingly, the number of the signals OUT_D_RATE_CON_4X and OUT_D_RATE_CON_8X inputted from the outside through the predetermined first pads 260A and 260B for adjusting the data input/output bandwidth is two, and through this, four cases of the data input/output bandwidth can be selected. However, the exemplified semiconductor memory device has three data input/output bandwidth classified into X4, X8 and X16.

That is, as shown below in Table 1, when logic levels of the signals OUT_D_RATE_CON_4X and OUT_D_RATE_CON_8X inputted from the outside through the predetermined first pads 260A and 260B for adjusting the data input/output bandwidth are combined, the part not used for adjusting the data input/output bandwidth is used for controlling the entry into the wafer burn-in test mode.

Therefore, the predetermined first pads 260A and 260B in accordance with the first embodiment of the present invention are not required to receive the signals OUT_D_RATE_CON_4X and OUT_D_RATE_CON_8X for adjusting the data input/output bandwidth only and may receive a signal for defining another operational mode of the semiconductor device.

TABLE 1

| OUT_D_RATE_CON_4X | OUT_D_RATE_CON_8X | WBI_TEST_ENTRY | |
|---|---|---|---|
| L | L | L | D_RATE_CON_16x |
| L | H | L | D_RATE_CON_8x |
| H | L | L | D_RATE_CON_4x |
| H | H | H | WAFER BURN_IN TEST |

Also, Table 1 shows that only one of the three signals D_RATE_CON_4X, D_RATE_CON_8X and D_RATE_CON_16X for adjusting the data input/output bandwidth and the test signal WBI_TEST_ENTRY for controlling the entry into the wafer burn-in test mode outputted from the signal generating unit 280 is activated. This means that when the semiconductor memory device selects one of the three data input/output bandwidths, the semiconductor memory device may not enter the wafer burn-in test mode, and when the semiconductor memory device enters the wafer burn-in test mode, the data input/output bandwidth may not be selected since the semiconductor memory device has one of the three data input/output bandwidth or enters the wafer burn-in test mode according to the combination of the signals OUT_D_RATE_CON_4X and OUT_D_RATE_CON_8X inputted from the outside through the predetermined first pads 260A and 260B for adjusting the data input/output bandwidth.

The predetermined second pad 200 is connected to a pin when the semiconductor device performs a normal mode operation in the packaged state to play a role of receiving the externally inputted reset signal OUT_RESETb. However, when the semiconductor device performs the wafer burn-in test mode operation in the wafer-in state, a probe is not connected to the predetermined second pad 200 so that the predetermined second pad 200 does not receive any signals.

However, as above-mentioned in the background of the invention, the predetermined second pad 200 may also supplied with a significant amount of the electric signal due to the electric signal being inputted to a neighboring pad when the semiconductor device performs the wafer burn-in test mode operation.

Therefore, the external reset signal OUT_RESETb inputted to the predetermined second pad 200 may have an unwanted voltage level in the wafer burn-in test mode.

In case of the first embodiment of the present invention shown in FIG. 2, it is assumed that the predetermined second pad is a reset input pad for receiving the external reset signal OUT_RESETb from the outside. Therefore, if the external reset signal OUT_RESETb inputted from the outside through the predetermined second pad 200 is transferred to the plurality of internal circuits 250_1 to 250_N included in the semiconductor device, the plurality of internal circuits 250_1 to 250_N are changed to a predetermined initial state.

When the test signal WBI_TEST_ENTRY for controlling the entry into the wafer burn-in test mode is activated and thus the semiconductor device enters the wafer burn-in test mode, the logic level fixing unit 230 controls a logic level of the external reset signal OUT_RESETb and the buffered reset signal BUF_RESETb inputted from the outside through the predetermined second pad 200 and the second input buffer 210 to be a predetermined logic level unconditionally and outputs the controlled signal as the fixed reset signal LOGIC_FIX_RESETb. In other words, the logic level fixing unit 230 controls the external reset signal OUT_RESETb and the buffered reset signal BUF_RESETb inputted from the outside through the predetermined second pad 200 and the second input buffer 210 to be unconditionally inactivated to a logic high level.

However, the wafer burn-in test mode is avoided because the test signal WBI_TEST_ENTRY for controlling the entry into the wafer burn-in test mode is inactivated, the logic level fixing unit 230 passes the external reset signal OUT_RESETb and the buffered reset BUF_RESETb inputted from the outside through the predetermined second pad 200 and the second input buffer 210 to output the reset signal as the fixed reset signal LOGIC_FIX_RESETb. That is, the logic level fixing unit 230 controls the external reset signal OUT_RESETb and the buffered reset signal BUF_RESETb inputted from the outside through the predetermined second pad 200 and the second input buffer 210 to be the same as the fixed reset signal LOGIC_FIX_RESETb outputted from the logic level fixing unit 230.

As a result, in case that there is a possibility of inputting the external reset signal OUT_RESETb which has an incorrect logic level because the semiconductor memory device performs the wafer burn-in test mode operation, i.e., in case that there is a possibility of inputting the activated external reset signal OUT_RESETb from the outside, it is filtered by the logic level fixing unit 230 to be changed to the inactivated fixed reset signal LOGIC_FIX_RESETb and transferred to the plurality of internal circuits 250_1 to 250_N. Therefore, the plurality of internal circuits 250_1 to 250_N can normally perform the predetermined operation according to the wafer burn-in test mode operation with no problem.

However, in case that there is no possibility of inputting the external reset signal OUT_RESETb with an incorrect logic level, i.e., in case of inputting only the external reset signal OUT_RESETb activated or inactivated as intended, it is not filtered by the logic level fixing unit 230 so as to pass the logic level fixing unit 230 so that the external reset signal OUT_RESETb activated or inactivated as intended is transferred to the plurality of internal circuits 250_1 to 250_N as the fixed reset signal LOGIC_FIX_RESETb.

Figure 3:
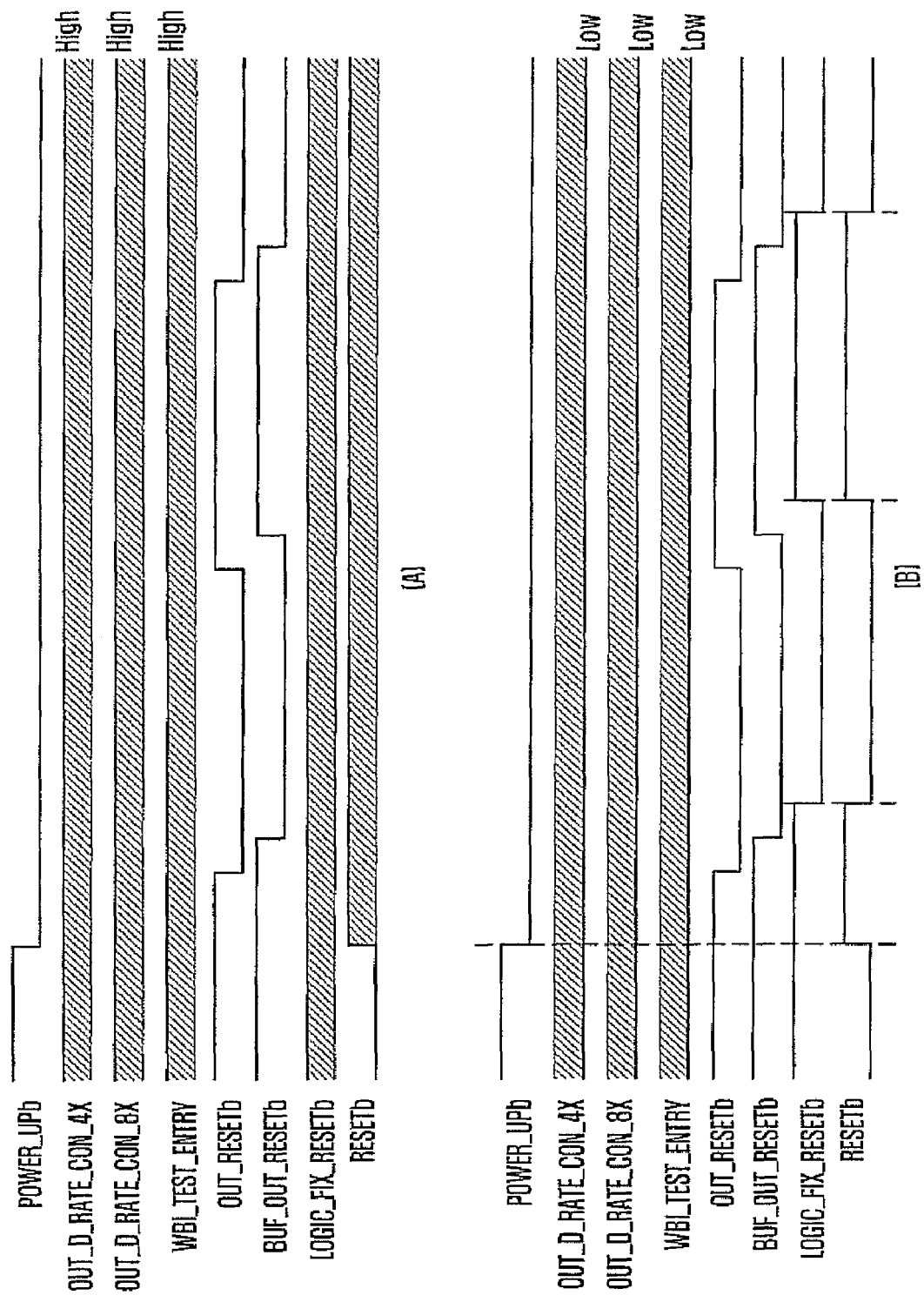
FIG. 3 is a timing diagram for explaining an operation of filtering the reset signal inputted from the outside through the reset input pad when the semiconductor device in accordance with the first embodiment of the preset invention performs the wafer burn-in test operation.

FIG. 3 is a timing diagram for explaining an operation of filtering the external reset signal OUT_RESET inputted from the outside through the reset input pad when the semiconductor device in accordance with the first embodiment of the present invention performs the wafer burn-in test operation.

As shown, logic levels of the external reset signal OUT_RESET, the fixed reset signal LOGIC_FIX_RESETb and the internal reset signal RESETb are differently changed according to whether the test signal WBI_TEST_ENTRY for controlling the entry into the wafer burn-in test mode is activated to a logic high level or inactivated to a logic low level in response to the signals OUT_D_RATE_CON_4X and OUT_ D_RATE_CON_8X inputted from the outside through the predetermined first pads 260A and 260B that include the two pads D_RATE_CON PAD(4X) and D_RATE_CON PAD(8X).

More specifically, if all the signals OUT_D_RATE_ CON_4X and OUT_D_RATE_CON_8X inputted from the outside through the predetermined first pads 260A and 260B provided with the two pads D_RATE_CON PAD(4X) and D_RATE_CON PAD(8X) are activated to a logic high level, in response to this, the test signal WBI_TEST_ENTRY for controlling the entry into the wafer burn-in test mode is activated to a logic high level (A).

In this state, if the external reset signal OUT_RESET is inactivated to a logic high level and then activated to a logic low level repeatedly, such changes are buffered to be output as the buffered reset signal BUF_RESETb. However, the fixed reset signal LOGIC_FIX_RESETb outputted from the logic level fixing unit 230 and the internal reset signal RESETb outputted from the reset unit 240 keeps the inactivated state of a logic high level.

However, unlike the fixed reset signal LOGIC_FIX_RE- SETb which is outputted from the logic level fixing unit 230 and is continuously inactivated to a logic high level regardless of a logic level of the power-up signal POWER_UPb, the internal reset signal RESETb outputted from the reset unit 240 is inactivated to a logic high level after the power-up signal POWER_UPb is activated to a logic low level. This is because a logic level of the internal reset signal RESETb outputted from the reset unit 240 is changed in response to not only the fixed reset signal LOGIC_FIX_RESETb outputted from the logic level fixing unit 230 but also the power-up signal POWER_UPb and the MRS reset signal MRS_RE- SETb outputted from the MRS.

As a result, even if the external reset signal OUT_RESETb inputted from the outside is activated in case of entering the wafer burn-in test mode, the semiconductor device in accordance with the first embodiment of the present invention filters this out and outputs it as the inactivated internal reset signal RESETb.

If all the signals OUT_D_RATE_CON_4X and OUT_ D_RATE_CON_8X inputted from the outside through the predetermined first pads 260A and 260B provided with the two pads D_RATE_CON PAD(4X) and D_RATE_CON PAD(8X) are inactivated to a logic low level, in response to this, the test signal WBI_TEST_ENTRY for controlling the entry into the wafer burn-in test mode is inactivated to a logic low level (B).

In this state, if the external reset signal OUT_RESET inputted from the outside through the predetermined second pad 200 is inactivated to a logic high level and then activated to a logic low repeatedly so as to toggle back and forth between the two states, not only the buffered reset signal BUF_RESETb outputted from the second input buffer 210 connected to the predetermined second pad 200 but also the fixed reset signal LOGIC_FIX_RESETb outputted from the logic level fixing unit 230 and the internal reset signal RESETb outputted from the reset unit 240 are repeatedly inactivated to a logic high level and activated to a logic low level back and forth.

At this time, unlike the fixed reset signal LOGIC_FIX_RE- SETb which is outputted from the logic level fixing unit 230 and continues to be inactivated to a logic high level and activated to a logic low level repeatedly regardless of a logic level of the power-up signal POWER_UPb, the internal reset signal RESETb outputted from the reset unit 240 is repeatedly inactivated to a logic high level and activated to a logic low level after the power-up signal POWER_UPb is activated to a logic low level. This is because a logic level of the internal reset signal RESETb outputted from the reset unit 240 is changed in response to not only the fixed reset signal LOGIC_FIX_RESETb outputted from the logic level fixing unit 230 but also the power-up signal POWER_UPb and the MRS reset signal MRS_RESETb outputted from the MRS 220.

As a result, when the wafer burn-in test mode is avoided, the semiconductor device in accordance with the first embodiment of the present invention does not filter the external reset signal OUT_RESETb inputted from the outside but just passes the external reset signal OUT_RESETb to output it as the inactivated internal reset signal RESETb.

Second Embodiment

Figure 4:
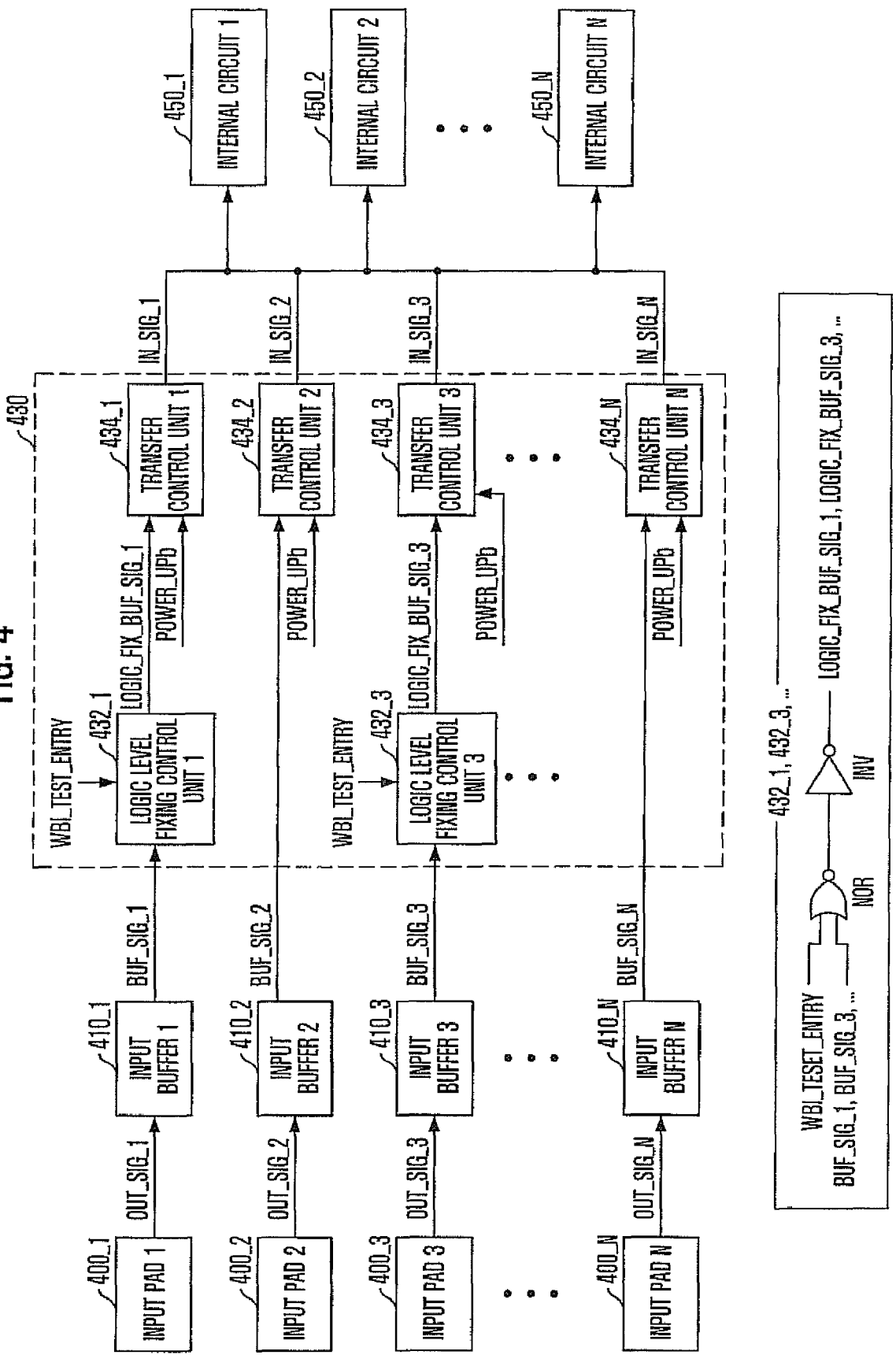
FIG. 4 is a block diagram for explaining an operation of filtering an electric signal falsely inputted to an internally provided pad when a wafer burn-in test mode operation is performed in a semiconductor device in accordance with a second embodiment of the present invention.

FIG. 4 is a block diagram for explaining an operation of filtering an electric signal falsely inputted to an internally provided pad when a wafer burn-in test mode operation is performed in a semiconductor device in accordance with a second embodiment of the present invention.

As shown, the semiconductor device in accordance with the second embodiment of the present invention includes a plurality of input pads 400_1 to 400_N for receiving a plurality of external signals OUT_SIG_1 to OUT_SIG_N; a plurality of internal circuits 450_1 to 450_N for performing a predetermined internal operation in response to the external signals OUT_SIG_1 to OUT_SIG_N inputted through the plurality of input pads 400_1 to 400_N; and a signal transferring unit 430 for fixing the external signals OUT_SIG_1, OUT_SIG_3 and etc. inputted through predetermined input pads 400_1, 400_3 and etc. among the plurality of input pads 400_1 to 400_N at a predetermined logic level and transferring the fixed signals to the internal circuits 450_1 to 450_N in a test mode.

Also, the semiconductor device further includes a plurality of input buffers 410_1 to 410_N connected to the plurality of input pads 400_1 to 400_N respectively for buffering the external signals OUT_SIG_1 to OUT_SIG_N inputted through the plurality of input pads 400_1 to 400_N and outputting the buffered signals as a plurality of signals BUF_SIG_1 to BUF_SIG_N.

Herein, the signal transferring unit 430 includes a plurality of logic level fixing control units 432_1, 432_3 and etc. for controlling of fixing a logic level of the external signals OUT_SIG_1, OUT_SIG_3 and etc. inputted through the predetermined input pads 400_1, 400_3 and etc. among the plurality of input pads 400_1 to 400_N in response to a test signal WBI_TEST_ENTRY for controlling the entry into the test mode; first transferring control units 434_1, 434_3 and etc. for controlling of transferring a plurality of fixed signals LOGIC_FIX_BUF_SIG_1, LOGIC_FIX_BUF_SIG_3 and etc. outputted from the logic level fixing control units 432_1, 432_3 and etc. to the internal circuits 450_1 to 450_N as a plurality of internal reset signals IN_SIG_1, IN_SIG_3 and etc. to the internal circuits 450_1 to 450_N in response to a power-up signal POWER_UPb; and second transferring control units 434_2, 434_4 and etc. for controlling of transferring the external signals OUT_SIG_2, OUT_SIG_4 and etc. inputted through the remaining input pads 400_2, 400_4 and etc. except for the predetermined input pads 400_1, 400_3 and etc. among the plurality of input pads 400_1 to 400_N as the internal reset signals IN_SIG_2, IN_SIG_4 and etc. to the internal circuits 450_1 to 450_N in response to the power-up signal POWER_UPb.

Also, since the plurality of input buffers 410_1 to 410_N are respectively connected to the plurality of pads 400_1 to 400_N to buffer the external signals OUT_SIG_1 to OUT_SIG_N and output the buffered signals BUF_SIG_1 to BUF_SIG_N, the signal transferring unit 430 is a structure for fixing the buffered signals BUF_SIG_1, BUF_SIG_3 and etc., which are outputted by buffering the external signals OUT_SIG_1, OUT_SIG_3 and etc. inputted through the predetermined input pads 400_1, 400_3 and etc. among the plurality of input pads 400_1 to 400_N at the predetermined input buffers 410_1, 410_3 and etc. among the plurality of input buffers 410_1 to 410_N, at the predetermined logic level and transferring the fixed signals to the internal circuits 450_1 to 450_N. The logic level fixing control units 432_1, 432_3 and etc. provided to the signal transferring unit 430 are a structure for controlling of fixing a logic level of the buffered signals BUF_SIG_1, BUF_SIG_3 and etc. outputted by buffering the external signals OUT_SIG_1, OUT_SIG_3 and etc. inputted through the predetermined input pads 400_1, 400_3 and etc. among the plurality of input pads 400_1 to 400_N at the predetermined input buffers 410_1, 410_3 and etc. connected to the predetermined input pads 400_1, 400_3 and etc. in response to the test signal WBI_TEST_ENTRY for controlling the entry into the test mode. The second transferring control units 434_2, 434_4 and etc. provided to the signal transferring unit 430 are a structure for controlling of transferring the buffered signals BUF_SIG_2, BUF_SIG_4 and etc., which are outputted by buffering the external signals OUT_SIG_2, OUT_SIG_4 and etc. inputted through the remaining input pads 400_2, 400_4 and etc. except for the predetermined input pads 400_1, 400_3 and etc. among the plurality of input pads 400_1 to 400_N at the remaining input buffers 410_2, 410_4 and etc. connected to the remaining input pads 400_2, 400_4 and etc., to the internal circuits 450_1 to 450_N in response to the power-up signal POWER_UPb.

Each of the logic level fixing units 432_1, 432_3, and etc. includes a NOR gate NOR for performing a logic NOR operation to the test signal WBI_TEST_ENTRY for controlling the entry into the test mode and the buffered signals BUF_SIG_1, BUF_SIG_3 and etc. outputted by buffering the external signals OUT_SIG_1, OUT_SIG_3 and etc. inputted through the predetermined input pads 400_1, 400_3 and etc. among the plurality of input pads 400_1 to 400_N at the predetermined input buffers 410_1, 410_3 and etc. connected to the predetermined input pads 400_1, 400_3 and etc.; and an inverter INV for inverting a phase of an output signal of the NOR gate NOR and outputting the inverted signal as the fixed signals LOGIC_FIX_BUF_SIG_1, LOGIC_FIX_BUF_SIG_3 and etc.

With the above-mentioned configurations, an operation of the semiconductor device in accordance with the second embodiment of the present invention is described as follows.

Firstly, the predetermined input pads 400_1, 400_3 and etc. among the plurality of input pads 400_1 to 400_N are connected to a pin when the semiconductor device performs a normal mode operation in the packaged state to receive the externally inputted signals OUT_SIG_1, OUT_SIG_3 and etc. However, when the semiconductor device performs the wafer burn-in test mode operation in the wafer-in state, the predetermined pads are not connected to a probe that receives a signal.

However, as above-mentioned in the background of the invention, the predetermined input pads 400_1, 400_3 and etc. among the plurality of input pads 400_1 to 400_N are also supplied with a significant amount of the electric signal because of the electric signal inputted to a neighboring pad when the semiconductor device performs the wafer burn-in test mode operation.

Therefore, the external signals OUT_SIG_1, OUT_SIG_3 and etc. inputted to the predetermined input pads 400_1, 400_3 and etc. among the plurality of input pads 400_1 to 400_N may have an unwanted voltage level in the wafer burn-in test mode.

When the test signal WBI_TEST_ENTRY for controlling the entry into the wafer burn-in test mode is activated to a logic high level so that the semiconductor device enters the wafer burn-in test mode, the signal transferring unit 430 fixes a logic level of the buffered reset signals BUF_SIG_1, BUF_SIG_3 and etc. inputted from the outside through the predetermined input pads 400_1, 400_3 and etc. and the predetermined input buffers 410_1, 410_3 and etc. to be unconditionally at a predetermined logic level and transfers the fixed signals to the internal circuits 450_1 to 450_N.

More specifically, the logic level fixing control units 432_1, 432_3 and etc. among the elements of the signal transferring unit 430 fix a logic level of the buffered signals BUF_SIG_1, BUF_SIG_3 and etc. inputted from the outside through the predetermined input pads 400_1, 400_3 and etc. and the predetermined input buffers 410_1, 410_3 and etc. to be at the predetermined logic level unconditionally and output the fixed signals LOGIC_FIX_BUF_SIG_1, LOGIC_FIX_BUF_SIG_3 and etc. in response to the activation to a logic high level of the test signal WBI_TEST_ENTRY for controlling the entry into the wafer burn-in test mode.

Also, the first transferring units 434_1, 434_3 and etc. among the elements of the signal transferring unit 430 transfer the fixed signals LOGIC_FIX_BUF_SIG_1, LOGIC_FIX_BUF_SIG_3 and etc. whose logic level is fixed to the predetermined logic level by the logic level fixing control units 432_1, 432_3 and etc. to the internal circuits 450_1 to 450_N in response to the power-up signal POWER_UPb.

The second transferring units 434_2, 434_4 and etc. among the elements of the signal transferring unit 430 transfer the buffered signals BUF_SIG_2, BUF_SIG_4 and etc. inputted from the outside through the remaining input pads 400_2, 400_4 and etc. except for the input predetermined pads 400_1, 400_3 and etc. among the plurality of input pads 400_1 to 400_N and the remaining input buffers 410_2, 410_4 and etc. to the internal circuits 450_1 to 450_N in response to the power-up signal POWER_UPb.

However, when the wafer burn-in test mode is avoided because the test signal WBI_TEST_ENTRY for controlling the entry into the wafer burn-in test mode is inactivated to a logic low level, the signal transferring unit 430 passes the external signals OUT_SIG_1, OUT_SIG_3 and etc. and the buffered signals BUF_SIG_1, BUF_SIG_3 and etc. inputted from the outside through the predetermined input pads 400_1, 400_3 and etc. and the predetermined input buffers 410_1, 410_3 and etc. to transfer those signals to the internal circuits 450_1 to 450_N.

More specifically, the logic level fixing units 432_1, 432_3 and etc. among the elements of the signal transferring unit 430 pass the external signals OUT_SIG_1, OUT_SIG_3 and etc. and the buffered signals BUF_SIG_1, BUF_SIG_3 and etc. inputted from the outside through the predetermined input pads 400_1, 400_3 and etc. and the predetermined input buffers 410_1, 410_3 and etc. by not fixing logic levels of the output signals LOGIC_FIX_BUF_SIG_1, LOGIC_FIX_BUF_SIG_3 and etc. in response to an inactivation to a logic low level of the test signal WBI_TEST_ENTRY for controlling the entry into the wafer burn-in test mode.

Also, the first transferring units 434_1, 434_3 and etc. among the elements of the signal transferring unit 430 transfer the fixed signals LOGIC_FIX_BUF_SIG_1, LOGIC_FIX_BUF_SIG_3 and etc., which have passed the logic level fixing units 432_1, 432_3 and etc. but whose logic level have not been fixed, to the internal circuits 450_1 to 450_N in response to the power-up signal POWER_UPb The second transferring units 434_2, 434_4 and etc. among the elements of the signal transferring unit 430 transfer the external signals OUT_SIG_2, OUT_SIG_4 and etc. and the buffered signals BUF_SIG_2, BUF_SIG_4 and etc. inputted from the outside through the remaining input pads 400_2, 400_4 and etc. except for the predetermined input pads 400_1, 400_3 and etc. among the plurality of input pads 400_1 to 400_N and the remaining input buffers 410_2, 410_4 and etc. to the internal circuits 450_1 to 450_N in response to the power-up signal POWER_UPb.

As a result, if there is a possibility that the external signals OUT_SIG_1, OUT_SIG_3 and etc. inputted from the outside through the predetermined input pads 400_1, 400_3 and etc. among the plurality of input pads 400_1 to 400_N have an incorrect logic level due to the semiconductor memory device performing the wafer burn-in test mode operation, those are filtered by the signal transferring unit 430 to be changed to the fixed signals LOGIC_FIX_BUF_SIG_1, LOGIC_FIX_BUF_SIG_3 and etc. whose logic level is fixed to the predetermined logic level and transferred to the plurality of internal circuits 450_1 to 450_N. Therefore, the plurality of internal circuits 450_1 to 450_N can normally perform the predetermined operation according to the wafer burn-in test mode operation with no problem.

However, if the external signals OUT_SIG_1, OUT_SIG_3 and etc. inputted from the outside through the predetermined input pads 400_1, 400_3 and etc. among the plurality of input pads 400_1 to 400_N are not likely to have an incorrect logic level since the semiconductor memory device is in a normal mode operation, those external signals are not filtered by the signal transferring unit 430 and are passed through the signal transferring unit 430 to the internal circuits 450_1 to 450_N as signals whose logic levels have not been fixed.

As above-described, by applying the embodiments of the present invention, even if an incorrect electric signal is inputted to a pad which is not connected to a probe and should not receive a signal when the wafer burn-in test mode operation is performed, the semiconductor device can be prevented from the abnormal operation due to the unintentionally inputted electric signal by filtering and removing the falsely inputted electric signal before the unintentionally inputted electric signal is inputted to the plurality of internal circuits included in the semiconductor device.

Particularly, semiconductor devices may be prevented from being initialized due to the reset signal inputted from the outside through the reset input pad by detecting the wafer burn-in test mode operation and inactivating the internal reset signal generated in response to the reset signal inputted from the outside even if the activated reset signal is inputted when the wafer burn-in test mode operation is performed and the reset signal should not be inputted.

While the present invention has been described with respect to the specific embodiments, it will be apparent to those skilled in the art that various changes and modifications may be made without departing from the spirit and scope of the invention as defined in the following claims.

For instance, the position and type of the logic gates and transistors exemplified in the above-mentioned embodiments should be modified according to polarity of an inputted signal.

What is claimed is:

1. A semiconductor device, comprising:
   a signal generating unit configured to generate a bandwidth selection signal for adjusting a data input/output bandwidth or generate a test mode selection signal for controlling an entry into a test mode in response to a signal inputted externally through a predetermined first pad;
   a reset unit configured to initialize an internal circuit in response to a signal inputted externally through a predetermined second pad; and
   a logic level fixing unit configured to pass the signal inputted through the predetermined second pad during a normal mode and output a fixed signal regardless of changes in the signal inputted through the predetermined second pad in response to the test mode selection signal.

2. The semiconductor device of claim 1, wherein the signal generating unit is configured to inactivate the bandwidth selection signal when the test signal is activated so as to enter the test mode.

3. The semiconductor device of claim 1, wherein the logic level fixing unit is configured to output the fixed signal regardless of changes in the signal inputted through the predetermined second pad when the test mode selection signal is activated so as to enter the test mode.

4. The semiconductor device of claim 1, wherein the logic level fixing unit is configured to pass the signal inputted through the predetermined second pad as an output signal of the logic level fixing unit when the test mode selection signal is inactivated.

5. The semiconductor device of claim 1, wherein the predetermined second pad is a reset input pad and the signal inputted through the predetermined second pad is a reset signal.

6. A semiconductor device, comprising:
   a signal generating unit configured to generate a bandwidth selection signal for adjusting a data input/output bandwidth or generate a test mode selection signal for controlling an entry into a test mode in response to a plurality of signals inputted from the outside through a plurality of control signal input pads;

a reset unit configured to initialize a plurality of internal circuits in response to a reset signal inputted externally through a reset signal input pad; and a logic level fixing unit configured to pass the reset signal as an output of the logic level fixing unit during a normal operation and output a fixed signal regardless of changes in the reset signal in response to the test mode selection signal.

7. The semiconductor device of claim 6, wherein the signal generating unit is configured to inactivate the bandwidth selection signal when the test mode selection signal is activated so as to enter the test mode.

8. The semiconductor device of claim 6, wherein the logic level fixing unit is configured to output the fixed signal regardless of changes in the reset signal when the test mode selection signal is activated so as to enter the test mode.

9. The semiconductor device of claim 6, wherein the logic level fixing unit is configured to pass the reset signal as an output of the logic level fixing unit when the test mode selection signal is inactivated.

* * * * *